US011239634B2

(12) United States Patent
Osinski et al.

(10) Patent No.: US 11,239,634 B2
(45) Date of Patent: Feb. 1, 2022

(54) RING LASER INTEGRATED WITH SILICON-ON-INSULATOR WAVEGUIDE

(71) Applicant: STC.UNM, Albuquerque, NM (US)

(72) Inventors: Marek Osinski, Albuquerque, NM (US); Gennady A. Smolyakov, Albuquerque, NM (US)

(73) Assignee: UNM Rainforest Innovations, Albuquerque, NM (US)

( * ) Notice: Subject to any disclaimer, the term of this patent is extended or adjusted under 35 U.S.C. 154(b) by 661 days.

(21) Appl. No.: 16/081,028

(22) PCT Filed: Feb. 28, 2017

(86) PCT No.: PCT/US2017/019907
§ 371 (c)(1),
(2) Date: Aug. 29, 2018

(87) PCT Pub. No.: WO2017/200620
PCT Pub. Date: Nov. 23, 2017

(65) Prior Publication Data
US 2021/0151953 A1    May 20, 2021

Related U.S. Application Data

(60) Provisional application No. 62/301,414, filed on Feb. 29, 2016.

(51) Int. Cl.
*H01S 5/10* (2021.01)
*H01S 5/0225* (2021.01)
(Continued)

(52) U.S. Cl.
CPC ............ *H01S 5/1032* (2013.01); *H01S 5/021* (2013.01); *H01S 5/026* (2013.01); *H01S 5/0218* (2013.01);
(Continued)

(58) Field of Classification Search
CPC ...... H01S 5/1071; H01S 5/1075; H01S 5/021; H01S 5/0218; H01S 5/026; H01S 5/1032; H01S 5/4006; H01S 5/142
See application file for complete search history.

(56) References Cited

U.S. PATENT DOCUMENTS 4,792,962 A * 12/1988 Miyauchi ............... H01S 3/083
372/50.1
4,851,368 A    7/1989 Behfar-Rad et al.
(Continued)

FOREIGN PATENT DOCUMENTS

DE    3916962 A1 * 11/1990 ......... G02B 6/12004
JP    63164382 A  *  7/1988 ........... H01S 5/1071
(Continued)

OTHER PUBLICATIONS

Federal Institute of Industrial Property; International Search Report & Written Opinion for PCT/US2017/019907; dated Dec. 21, 2017; 8 pages.

*Primary Examiner* — Joshua King
(74) *Attorney, Agent, or Firm* — Keith Vogt, Ltd.; Keith A. Vogt (57) ABSTRACT

The present invention provides one or more injection-lockable whistle-geometry semiconductor ring lasers, which may be cascaded, that are integrated on a common silicon-on-insulator (SOI) substrate with a single-frequency semiconductor master laser, wherein the light output from the semiconductor master laser is used to injection-lock the first of the semiconductor ring lasers. The ring lasers can be operated in strongly injection-locked mode, while at least one of them is subjected to direct injection current modulation.

11 Claims, 8 Drawing Sheets

(51) Int. Cl.
*H01S 5/02* (2006.01)
*H01S 5/026* (2006.01)
*H01S 5/12* (2021.01)
*H01S 5/22* (2006.01)
*H01S 5/40* (2006.01)
*H01S 5/042* (2006.01)
*H01S 5/125* (2006.01)
*H01S 5/30* (2006.01)
*H01S 5/343* (2006.01)

(52) U.S. Cl.
CPC .......... *H01S 5/0225* (2021.01); *H01S 5/1071* (2013.01); *H01S 5/1075* (2013.01); *H01S 5/12* (2013.01); *H01S 5/22* (2013.01); *H01S 5/2205* (2013.01); *H01S 5/4006* (2013.01); *H01S 5/042* (2013.01); *H01S 5/04257* (2019.08); *H01S 5/125* (2013.01); *H01S 5/3013* (2013.01); *H01S 5/34306* (2013.01)

(56) References Cited

U.S. PATENT DOCUMENTS

| | | | | | |
|---|---|---|---|---|---|
| 5,349,601 | A | * | 9/1994 | Hohimer | H01S 5/026 372/6 |
| 5,825,799 | A | * | 10/1998 | Ho | B82Y 20/00 372/92 |
| 6,668,006 | B1 | * | 12/2003 | Margalit | G02B 6/12007 372/92 |
| 6,865,314 | B1 | * | 3/2005 | Blair | B82Y 20/00 385/15 |
| 6,891,865 | B1 | * | 5/2005 | Ma | H01S 5/141 372/20 |
| 6,965,128 | B2 | | 11/2005 | Holm | H01L 21/8258 257/103 |
| 6,978,067 | B2 | * | 12/2005 | Herbert | B82Y 20/00 385/39 |
| 7,257,283 | B1 | * | 8/2007 | Liu | G02B 6/12004 385/14 |
| 9,020,001 | B2 | | 4/2015 | Doerr | H01S 5/041 372/44.01 |
| 10,038,302 | B2 | * | 7/2018 | Taylor | H01S 5/1042 |
| 2003/0036217 | A1 | * | 2/2003 | Richard | H01S 5/021 438/98 |
| 2003/0058908 | A1 | * | 3/2003 | Griffel | H01S 5/1071 372/43.01 |
| 2003/0128922 | A1 | * | 7/2003 | Kolodziejski | G02B 6/12007 385/27 |
| 2004/0013367 | A1 | * | 1/2004 | Herbert | H01L 31/1075 385/39 |
| 2004/0022474 | A1 | * | 2/2004 | Lim | G02B 6/12007 385/4 |
| 2004/0037341 | A1 | * | 2/2004 | Tan | H01S 5/1021 372/94 |
| 2004/0114658 | A1 | * | 6/2004 | Stegmuller | H01S 5/1032 372/97 |
| 2008/0310474 | A1 | * | 12/2008 | Huang | H01S 5/10 372/66 |
| 2009/0034905 | A1 | * | 2/2009 | Ty Tan | G02B 6/12007 385/14 |
| 2009/0154505 | A1 | * | 6/2009 | Oh | H01S 5/1032 372/20 |
| 2010/0008390 | A1 | * | 1/2010 | Osinski | H01S 5/125 372/45.01 |
| 2010/0034223 | A1 | * | 2/2010 | Osinski | H01S 5/4006 372/18 |
| 2010/0061416 | A1 | * | 3/2010 | Mandorlo | H01S 5/1075 372/46.01 |
| 2011/0064106 | A1 | * | 3/2011 | Xu | H01S 5/1071 372/45.01 |
| 2012/0250714 | A1 | * | 10/2012 | Ohira | H01S 5/1071 372/45.01 |
| 2012/0320939 | A1 | * | 12/2012 | Baets | H01S 5/1032 372/45.01 |
| 2013/0221223 | A1 | * | 8/2013 | Caneau | G01N 21/59 250/340 |
| 2014/0044391 | A1 | * | 2/2014 | Iizuka | H01S 5/0264 385/14 |
| 2014/0161148 | A1 | | 6/2014 | Osinki et al. | |
| 2014/0185641 | A1 | * | 7/2014 | Yoshida | H01S 5/026 372/50.1 |
| 2015/0207296 | A1 | | 7/2015 | Rickman et al. | |
| 2015/0380900 | A1 | * | 12/2015 | Liang | H01S 5/1032 385/2 |
| 2016/0087398 | A1 | * | 3/2016 | Yoshida | G02B 6/29341 385/14 |
| 2016/0261092 | A1 | * | 9/2016 | Tassaert | H01S 5/1032 |
| 2017/0331249 | A1 | * | 11/2017 | Liang | H01S 5/0265 |

FOREIGN PATENT DOCUMENTS

| | | | | |
|---|---|---|---|---|
| JP | 2008294777 A | | 4/2008 | |
| WO | WO-03005499 A2 | * | 1/2003 | ........... H01S 5/1075 |
| WO | 2005057253 A2 | | 6/2005 | |
| WO | WO-2016043101 A1 | * | 3/2016 | ........... H01S 5/0651 |

* cited by examiner

RING LASER INTEGRATED WITH SILICON-ON-INSULATOR WAVEGUIDE

RELATED APPLICATIONS

This application claims the benefit of U.S. Provisional Application No. 62/301,414 filed Feb. 29, 2016, and herein incorporated by reference.

STATEMENT REGARDING FEDERALLY SPONSORED RESEARCH & DEVELOPMENT

This invention was made with government support under the grant number N00014-15-12190 awarded by the Office of Naval Research. The government has certain rights in the invention.

FIELD OF THE INVENTION

The present invention relates to semiconductor light-emitting laser devices and to an injection-lockable semiconductor ring laser integrated on a silicon-on-insulator (SOI) substrate with silicon photonic/electronic integrated circuit. The invention can be practiced over a wide range of ambient temperatures, from cryogenic (4 K) to room temperature and above.

BACKGROUND OF THE INVENTION

High-speed low-power superconducting rapid single flux quantum (SFQ) digital circuit technology offers significant advantages over the currently dominant CMOS digital technology (that consumes too much power) for a wide range of applications, ranging from digital radio frequency receivers to high-end computing.

The ultra-low power dissipation of SFQ circuits is of critical importance for many specific cryogenic applications, such as readouts of cryogenic sensor arrays and peripheral circuits for superconducting quantum bits. Future VLSI technologies will require even lower power and higher energy efficiency than is currently achievable in standard SFQ circuits.

Just as important for the overall efficiency of SFQ circuits are the energy efficiency aspects of the entire cryo-cooled system: energy-efficient packaging, output drivers, and interfaces. Part of the problem is maximizing the energy efficiency of the data link used to transfer data between cryogenic circuits and nominally room-temperature input/output interfaces. Optical data links have a lower heat conductivity compared to standard metal links. To maximize the optical data link energy efficiency, one needs to develop a low-power high-speed electro-optical (EO) converter or modulator capable of working with a few mV signals (typical SFQ output signal is ~1 ps pulses with an amplitude of ~2 mV, ~2Ω source impedance, and up to 100 GHz repetition rate). External EO modulators operating at speeds of 40 Gb/s are currently available commercially, and modulators operating at speeds in the 100-GHz range are under development. The widest reported 3-dB modulation bandwidth for Ti:LiNbO$_3$ EO modulators is 70 GHz, with the maximum measured frequency of 110 GHz. The drawback of the Ti:LiNbO$_3$ modulators, however, is their poor sensitivity, as represented by their unattractively high half-wave voltage V. Very high modulation frequency and broadband performance of the Ti:LiNbO$_3$ modulators come at the expense of too high $V_\pi$ (exceeding 3 V, while the desirable voltage is below 1 V), which makes amplification of output SFQ data signals necessary. Based on the analysis of prospects for ultrafast, low-power data transmission at room temperature, active laser transmitters offer a better solution for satisfying stringent thermal requirements for cryogenic data links than external modulators. Polarization-modulating-vertical-cavity-surface-emitting lasers (VCSELs) were considered to be a good candidate for these EO devices. VCSELS, however, are intrinsically high-voltage devices that cannot be a good energy-efficient solution for the optical data links. Therefore, energy-efficient directly modulated laser sources with very high modulation bandwidths exceeding 100 GHz are highly desirable for the cryogenic optical data link applications.

Optical injection locking has been actively researched for its potential to improve ultrahigh frequency performance of semiconductor lasers and to reach beyond the record values of modulation bandwidth achieved for free-running devices. Injection locking was first demonstrated in 1976 using edge-emitting lasers and in 1996 for VCSELs. The technique uses the output of one laser (master) to optically lock another laser (slave), which can still be directly modulated. Significant increase in the resonance frequency and modulation bandwidth, accompanied by a reduction in nonlinear distortions and frequency chirp, has been achieved by injecting external light into diode lasers. So far, improved microwave performance has been observed in edge-emitting lasers with a Fabry-Perot cavity, distributed-feedback (DFB) lasers, and VCSELs. The highest experimentally observed 3-dB modulation bandwidth of ~80 GHz, by far exceeding those achieved for free-running devices, has been reported in injection-locked VCSELs and DFB lasers.

Many aspects of the injection-locking experimental results have been reproduced in analytical studies and numerical simulations using rate equation models. Dynamic behavior of diode lasers is described by a system of coupled nonlinear differential equations for the optical field and carrier density in the laser cavity. While for a free-running laser these equations exhibit only damped oscillations with corresponding relaxation oscillation frequency and damping rate, external optical injection increases the number of degrees of freedom by one, which leads to a much greater variety of dynamic behavior. In particular, perturbation analysis of rate equations revealed that the enhanced resonance frequency (the peak frequency in the modulation frequency response) was identical to the difference between the injected light frequency and a shifted cavity resonance, which agreed well with experimental observations. Under strong optical injection, a beating between the injected light frequency and the cavity resonant frequency dominates the dynamic behavior.

Since the detuning between frequencies of the injected light and the cavity mode controls the enhanced resonance frequency in the modulation response of injection-locked semiconductor lasers, obtaining the widest possible stable locking range in terms of the frequency detuning becomes the immediate goal. Strong optical injection is, therefore, crucial for reaching the ultimate limits of modulation bandwidth enhancement in injection-locked lasers. The coupling rate coefficient $\kappa_c$ for optical injection locking is:

$$\kappa_c = c\sqrt{1-R}/(2n_{eff}L) = \sqrt{1-R}/\tau_{rt}, \quad (1)$$

where R is the reflectivity of the laser mirror through which the light is injected, L is the cavity length, c is the speed of light, $n_{eff}$ is the effective index, and $\tau_{rt} = 2n_{eff}L/c$ is the cavity roundtrip time.

The smallest possible values for both the cavity roundtrip time $\tau_{rt}$ and the reflectivity R of the mirror used for injection (maximizing the injection coupling rate coefficient $\kappa_c$) would be ideal for the strong-injection locking application. However, as dictated by the requirement to keep the threshold current at an acceptable level, the inherent design trade-off between these parameters makes further optimization of both edge-emitting lasers and VCSELs for enhanced high-speed performance very problematic. In edge-emitting lasers, the beneficial effect of a rather low mirror reflectivity R on the injection coupling rate coefficient $\kappa_c$ is frustrated by a large $\tau_{rt}$, resulting from relatively long laser cavities. Similarly, even though injection-locked VCSELs benefit greatly from very short cavities and, hence, very small $T_rt$, their high-speed performance, at the same time, is compromised by very high mirror reflectivities of typical VCSELs, resulting in coupling rate coefficients similar to edge emitters. Further enhancement of resonance frequency in injection-locked edge-emitting lasers and VCSELs is expected to come solely from higher power master lasers used for optical injection. Also, VCSELs pose a very challenging alignment problem in injection-locking configurations and, at the same time, are not suitable for monolithic integration when injection locking is the requirement.

Figure 1:
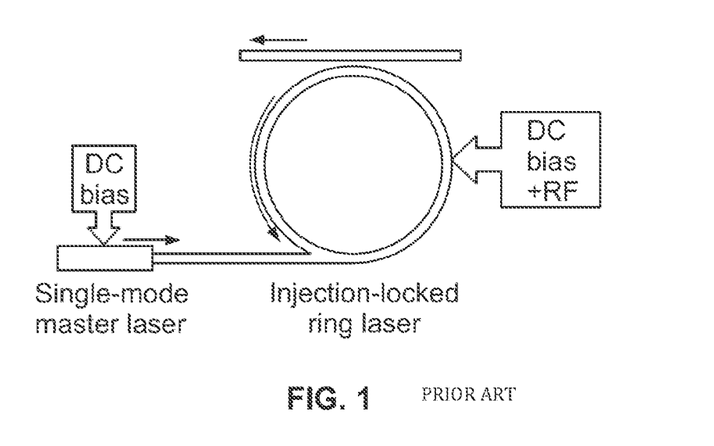
FIG. 1 is a schematic diagram of an optically injection-locked (strong injection) whistle-geometry ring laser monolithically integrated with a single-frequency master laser.

To overcome the limitations of injection-locked edge-emitting lasers and VCSELs described above, a novel injection locking scheme (FIG. 1), involving a single-frequency master laser monolithically integrated with a unidirectional whistle-geometry micro-ring laser (WRL), was developed and is described in the U.S. Pat. No. 8,009,712, the teachings of which are incorporated herein by reference. The geometry of FIG. 1 allows for a strong coupling of the master laser output into the ring slave laser, providing dramatically increased injection coupling rate. By the very nature of WRL, the low reflectivity for incident light would not at all compromise the quality of the ring cavity, and would not affect the threshold condition for the wave propagating in the favored direction. This makes WRLs free from the design constraints that edge-emitting lasers and VCSELs suffer from.

The advantage of the novel injection-locking scheme was confirmed in numerical modeling. The dynamics of an optically injection-locked WRL monolithically integrated with single-mode master DBR laser was modeled by a system of rate equations written in terms of the photon numbers, phases, and total carrier numbers in the master and WRL slave lasers.

In recent years, silicon-on-insulator (SOI) has emerged as a promising platform for ultracompact integration of passive photonic circuits due to the transparency of silicon at telecom wavelengths, its high refractive index contrast with $SiO_2$ or air, and its compatibility with complementary metal-oxide-semiconductor (CMOS) processing technology that can be used for fabricating photonic devices with sub-micrometer features. The absence of efficient and compact silicon-based laser source, due to the indirect bandgap of silicon, has been the major obstacle for large-scale silicon-based electronic-photonic integration.

One promising approach to creating electrically pumped laser sources for silicon photonics integration is the hybrid integration of III-V semiconductors on silicon. In this hybrid silicon platform, III-V wafers are bonded to a fully processed SOI wafer using molecular bonding. After the unprocessed III-V wafer is bonded to the patterned SOI wafer with epitaxial layers down, the III-V wafer substrate is removed, the diode lasers and other III-V components are lithographically aligned to the underlying SOI pattern and fabricated using conventional wafer-scale processing.

Figure 2:
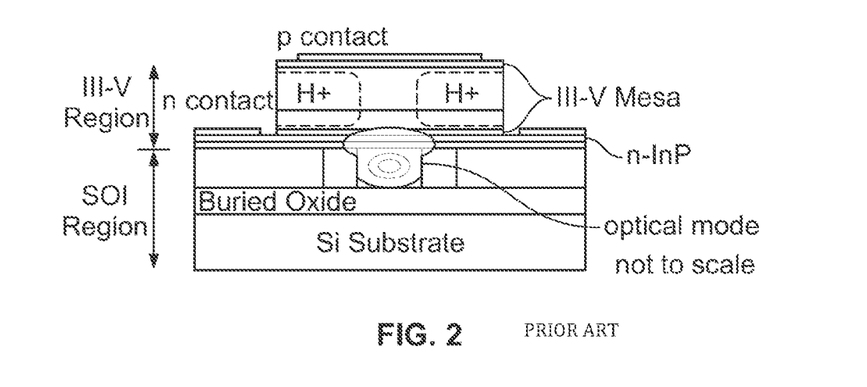
FIG. 2 shows a schematic cross section of a hybrid III-V-on-Si laser.

FIG. 2 shows a cross section of a hybrid III-V/silicon evanescent waveguide device that combines the superior gain characteristics of compound semiconductors with the superior passive waveguide characteristics of silicon waveguides. Lateral current confinement is achieved using proton implantation (indicated by $H^+$ in FIG. 2). The mode is confined predominantly in the rib, ridge, or buried silicon waveguide, with 3% to 8% of the mode intensity contained in the III-V quantum wells, thus forming a hybrid mode. The rib, ridge, or buried rectangular waveguide structures are defined, for example, in G. P. Agrawal and N. K. Dutta, Semiconductor Lasers, $2^{nd}$ Edition, Van Nostrand Reinhold, New York 1993.

Figure 3:
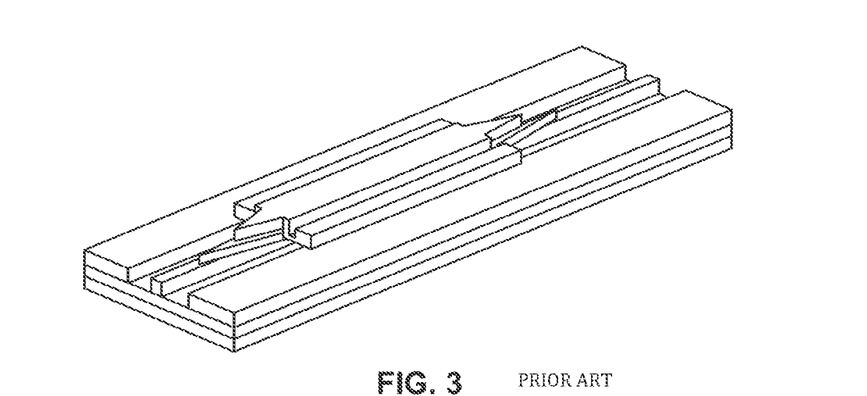
FIG. 3 is a schematic illustration of the transition taper of an active hybrid waveguide section to a passive silicon waveguide section.

The transition from a hybrid active waveguide to a passive silicon circuit (e.g., silicon waveguides) is achieved by tapering the III-V layer, as shown in FIG. 3.

Figure 4:
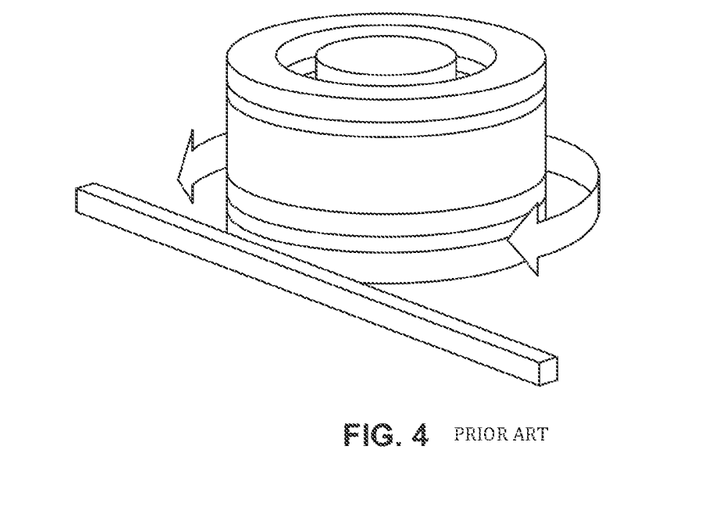
FIG. 4 is a schematic diagram of a hybrid microring laser with a Si bus waveguide.

Following the demonstration of hybrid Fabry-Perot lasers, DFB and distributed Bragg reflector (DBR) lasers with the same cross-sectional structure were fabricated in a similar hybrid III-V silicon platform. Compact electrically pumped III-V microring lasers with diameters of 15 to 50 μm have been successfully fabricated on top of silicon microdisks of the same diameter through a self-aligned process. In these hybrid microring lasers, the mode intensity is predominantly confined in the silicon microdisk resonator and is coupled out laterally through an adjacent silicon rib, ridge, or buried waveguide (FIG. 4).

Figure 5:
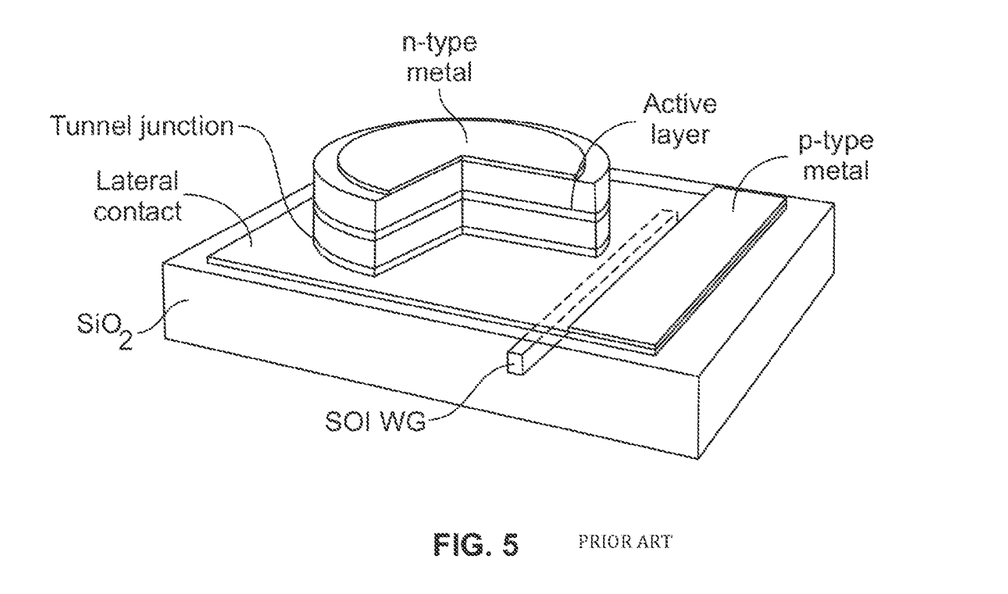
FIG. 5 shows a schematic diagram of a heterogeneously integrated III-V laser with a vertically coupled SOI waveguide underneath.

An alternative approach to the realization of a hybrid III-V-on-Si platform has been proposed and demonstrated with the goal of significantly improving the mode confinement in the III-V gain region. In this case, the optical confinement is primarily in the InP active layer of a compact InP-based microdisk laser that is evanescently vertically coupled to an external Si waveguide positioned underneath the III-V microdisk laser (FIG. 5). Lasing inside a compact microdisk III-V cavity and evanescent coupling to an external SOI waveguide resulted in sub-milliampere CW threshold.

BRIEF SUMMARY OF THE INVENTION

The present invention provides implementation of strongly injection-locked unidirectional whistle-geometry microring lasers in a hybrid silicon platform.

In one embodiment, the present invention provides a semiconductor light-emitting device comprising a III_V injection-lockable unidirectional whistle-geometry semiconductor ring laser integrated on a silicon-on-insulator (SOI) substrate. The ring laser can be operated in strongly injection-locked mode, while being subjected to direct injection current modulation.

In another embodiment, the present invention provides a semiconductor light-emitting device comprising an injection-lockable whistle-geometry semiconductor ring laser integrated on a common silicon-on-insulator (SOI) substrate with a single-frequency semiconductor master laser, wherein the light output from the semiconductor master laser is used to injection-lock the said semiconductor ring laser. The ring laser can be operated in strongly injection-locked mode, while being subjected to direct injection current modulation.

Practice of the present invention can be advantageous to provide high-performance small-size low-cost ultra-high-speed integrated light-emitting devices for silicon photonics integrated circuits that satisfy stringent thermal requirements for cryogenic data links. In particular, the present invention in all of its embodiments provides energy-efficient directly modulated laser sources with very high modulation bandwidths exceeding 100 GHz that are highly desirable for the cryogenic optical data link applications.

In another embodiment, the present invention provides a semiconductor light-emitting device comprising an injection-lockable unidirectional whistle-geometry semiconductor ring laser (WRL) III-V semiconductor section, and a single-frequency (distributed-feedback or distributed-Bragg-reflector) master laser section, both integrated with an interconnecting silicon-on-insulator (SOI) waveguide such that the ring laser section can be operated in a strongly injection-locked mode while being subjected to direct injection-current modulation.

In yet another embodiment, the present invention provides cascaded injection-lockable whistle-geometry semiconductor ring lasers integrated on a common silicon-on-insulator (SOI) substrate in such a way that the light output from one ring laser is carried by a directional waveguide coupler to another ring laser. Multiple stages of cascading can be implemented by taking this approach. The ring lasers can be operated in strongly injection-locked mode, while at least one of them is subjected to direct injection current modulation. The cascading of ring lasers advantageously flattens the modulation-frequency response and achieves a broadband transmitter operating at frequencies beyond 100 GHz.

In yet another embodiment, the present invention provides cascaded injection-lockable whistle-geometry semiconductor ring lasers integrated on a common silicon-on-insulator (SOI) substrate with a single-frequency semiconductor master laser, wherein the light output from the semiconductor master laser is used to injection-lock the first of the cascaded semiconductor ring lasers. The ring lasers can be operated in strongly injection-locked mode, while at least one of them is subjected to direct injection current modulation.

In another embodiment, the present invention provides a semiconductor light-emitting device comprising an injection-lockable whistle-geometry semiconductor ring laser integrated on a silicon-on-insulator (SOI) substrate.

In other embodiments, the ring laser cavity and ring laser may have circular, elliptical, oval, racetrack, or similar shape.

In other embodiments, the ring laser may be a hybrid III-V/silicon ring laser that comprises an electrically pumped III-V ring laser integrated on top of a silicon ring or disk cavity of the same or slightly different size and shape.

In other embodiments, the whistle-geometry of the ring laser may be determined by a passive silicon rib, ridge, or buried injecting waveguide monolithically integrated on the same SOI substrate and used to collect light from an external laser source and deliver it to the hybrid III-V/silicon ring laser by directly connecting to its silicon ring or disk cavity in whistle geometry.

In other embodiments, a monolithically integrated silicon rib, ridge, or buried waveguide directional coupler is located proximate, in the lateral direction, to the silicon ring or disk cavity of the hybrid III-V/silicon ring laser and is used to collect its output and further deliver it to a silicon photonic-electronic circuit integrated on the same SOI substrate.

In other embodiments, the hybrid III-V/silicon ring laser has a lateral dimension less than 100 micrometers.

In other embodiments, the ring laser is an electrically pumped III-V ring laser integrated on top of the SOI substrate on a silicon oxide layer.

In other embodiments, the whistle-geometry of the ring laser is determined by a passive III-V ridge injecting waveguide integrated on the same SOI substrate and used to collect light from an external laser source and deliver it to the III-V ring laser by directly connecting to its cavity in whistle geometry.

In other embodiments, a monolithically integrated silicon rib, ridge, or buried waveguide directional coupler is located underneath and proximate, in vertical direction, to the III-V ring laser cavity is used to collect the III-V ring laser output and further deliver it to a silicon photonic-electronic circuit integrated on the same SOI substrate.

In another embodiment, the present invention provides a semiconductor light-emitting device comprising an injection-lockable whistle-geometry semiconductor ring laser integrated on a common silicon-on-insulator (SOI) substrate with a single-frequency semiconductor master laser, wherein the light output from the semiconductor master laser is used to injection-lock the semiconductor ring laser. The ring laser cavity may have circular, elliptical, oval, racetrack, or similar shape.

In other embodiments, the master laser may be a hybrid III-V/silicon distributed-feedback or distributed-Bragg-reflector laser.

In other embodiments, the whistle-geometry of the ring laser is determined by a passive silicon rib or ridge injecting waveguide monolithically integrated on the same SOI substrate and used to collect light from the hybrid III-V/silicon master laser source and deliver it to the hybrid III-V/silicon ring laser by directly connecting to its silicon ring/disk cavity in whistle geometry.

In other embodiments, a pumped III-V ring laser integrated on top of the SOI substrate on a silicon oxide layer.

In other embodiments, the master laser is a III-V distributed-feedback or distributed-Bragg-reflector laser integrated on top of the same SOI substrate on a silicon oxide layer.

In other embodiments, a monolithically integrated silicon rib, ridge, or buried waveguide directional coupler located underneath and proximate, in vertical direction, to the III-V ring laser cavity is used to collect the III-V ring laser output and further deliver it to a silicon photonic-electronic circuit integrated on the same SOI substrate.

In other embodiments, the present invention provides at least two cascaded injection-lockable whistle-geometry semiconductor ring lasers integrated on a silicon-on-insulator (SOI) substrate. Each ring laser cavity may have circular, elliptical, oval, racetrack, or similar shape.

In other embodiments, the cascaded ring lasers are hybrid III-V/silicon ring lasers, each comprising an electrically pumped III-V ring laser integrated on top of a silicon ring or disk cavity of the same or slightly different size and shape.

In other embodiments, the whistle-geometry of the ring lasers is determined by passive silicon rib, ridge, or buried injecting waveguides monolithically integrated on the same SOI substrate and used: to collect light from an external laser source and deliver it to the first hybrid III-V/silicon ring laser by directly connecting to its silicon ring/disk cavity in whistle geometry; to collect light from the first hybrid III-V/silicon ring laser and deliver it to the second hybrid III-V/silicon ring laser by directly connecting to its silicon ring/disk cavity in whistle geometry.

In other embodiments, the cascaded ring lasers are electrically pumped III-V ring lasers integrated on top of the SOI substrate on a silicon oxide layer.

In other embodiments, the whistle-geometry of the ring lasers is determined by III-V ridge injecting waveguides monolithically integrated on the same SOI substrate and used: to collect light from an external laser source and deliver it to the first III-V ring laser by directly connecting to its cavity in whistle geometry; to collect light from the first III-V ring laser and deliver it to the second III-V ring laser by directly connecting to its cavity in whistle geometry.

In other embodiments, a monolithically integrated silicon rib, ridge, or buried waveguide directional coupler located underneath and proximate, in vertical direction, to a second III-V ring laser cavity is used to collect the second III-V ring laser output and further deliver it to a silicon photonic-electronic circuit integrated on the same SOI substrate.

In other embodiments, the present invention provides a semiconductor light-emitting device comprising at least two cascaded injection-lockable whistle-geometry semiconductor ring lasers integrated on a common silicon-on-insulator (SOI) substrate with a single-frequency semiconductor master laser, wherein the light output from the semiconductor master laser is used to injection-lock the cascaded semiconductor ring lasers. Each ring laser cavity may have circular, elliptical, oval, racetrack, or similar shape.

In other embodiments, the cascaded ring lasers are hybrid III-V/silicon ring lasers, each comprising an electrically pumped III-V ring laser integrated on top of a silicon ring or disk cavity of the same or slightly different size and shape.

In other embodiments, the present invention provides a method of making a low-power cryogenic optical data link to transfer data between the cryogenically cooled superconducting rapid single flux quantum (SFQ) digital circuits/sensors and room-temperature signal processors, the method comprising the steps of; providing a semiconductor ring laser or cascaded semiconductor ring lasers integrated on a silicon-on-insulator substrate inside the cryogenic environment; using the light output of a stable single-frequency master laser incorporated inside (monolithically and efficiently coupled with the semiconductor ring laser or cascaded semiconductor ring lasers) or outside of the cryogenic environment to injection-lock the semiconductor ring laser or cascaded semiconductor ring lasers; directly modulating the injection-locked semiconductor ring laser, or the first of the injection-locked cascaded semiconductor ring lasers, or the master laser with the superconducting digital logic signal; using the monolithically integrated silicon waveguides and/or external optical fibers to collect the ring laser modulated output and deliver it to the outside of the cryogenic environment for further signal processing.

In other embodiments, the present invention provides a semiconductor light-emitting device having a silicon-on-insulator (SOI) substrate, a silicon injecting waveguide formed in the substrate, a first passive silicon ring or disk formed in the substrate, the first passive silicon ring or disk directly are connected to the silicon injecting waveguide in a whistle configuration. The first silicon outcoupling waveguide is formed in the substrate, the first silicon outcoupling waveguide is adjacent to the first passive silicon ring or disk and laterally evanescently coupled to the first passive silicon ring or disk. A first active ring or disk laser is formed on top of the first passive silicon ring or disk, and vertically optically coupled to the first passive silicon ring or disk and optical output of the first active ring or disk laser is coupled to the first passive silicon ring or disk and collected by the first silicon outcoupling waveguide. The first silicon outcoupling waveguide may be directed at or near the Brewster angle with respect to the chip edge to reduce back reflections towards the first passive silicon ring or disk. The first silicon outcoupling waveguide may further deliver the output from the first active ring or disk laser to a silicon photonic-electronic circuit integrated on the substrate. The first passive and active rings or disks may have circular, elliptical, oval, racetrack, or similar shape and the first passive and active rings or disks may have the same or slightly different sizes and shapes. The first active ring or disk laser may be made of III-V materials, is electrically pumped, and is integrated on top of the first passive silicon ring or disk. A second laser may be coupled to the silicon injecting waveguide, with the second laser acting as a single-frequency master laser, and the first active ring or disk laser acting as a slave laser. The master laser may be a distributed-Bragg-reflector or distributed-feedback laser made of III-V materials and integrated on top of the silicon injecting waveguide.

In other embodiments, the active ring or disk laser and the injecting waveguide may be made of III-V materials, with the first active ring or disk laser electrically pumped. The injecting waveguide may be electrically pumped to reduce optical losses or to provide amplification. The first and second active ring or disk lasers may also be made of III-V materials, are electrically pumped, and are integrated on top of the first and second passive rings or disks, respectively.

In other embodiments, the number of passive and active rings or disks is larger than two, with correspondingly increased number of outcoupling silicon waveguides that further inject the optical output from the previous active ring or disk laser into the next passive silicon ring or disk in the cascade.

In other embodiments, the number of active ring or disk lasers is larger than two, with correspondingly increased number of outcoupling waveguides that further inject the optical output from the previous active ring or disk laser into the next active ring or disk laser in the cascade.

In all illustrative embodiments, the integrated device may be microchip-size that yields a low-cost ultrafast (over 100 GHz bandwidth) functional optical light transmitter. The integrated device can be optimized for operation in a wide range of ambient temperatures, from cryogenic to room temperature and above.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

To enable high-speed data transmission in silicon photonics, the embodiments of the present invention provide implementations of strongly injection-locked unidirectional whistle-geometry microring lasers in a hybrid III-V/silicon platform. The hybrid III-V/Si system of the strongly-injection locked microring slave(s) and the single-frequency master laser can be designed for operation at ambient temperatures ranging from 4 K to 300 K and above.

Figure 6:
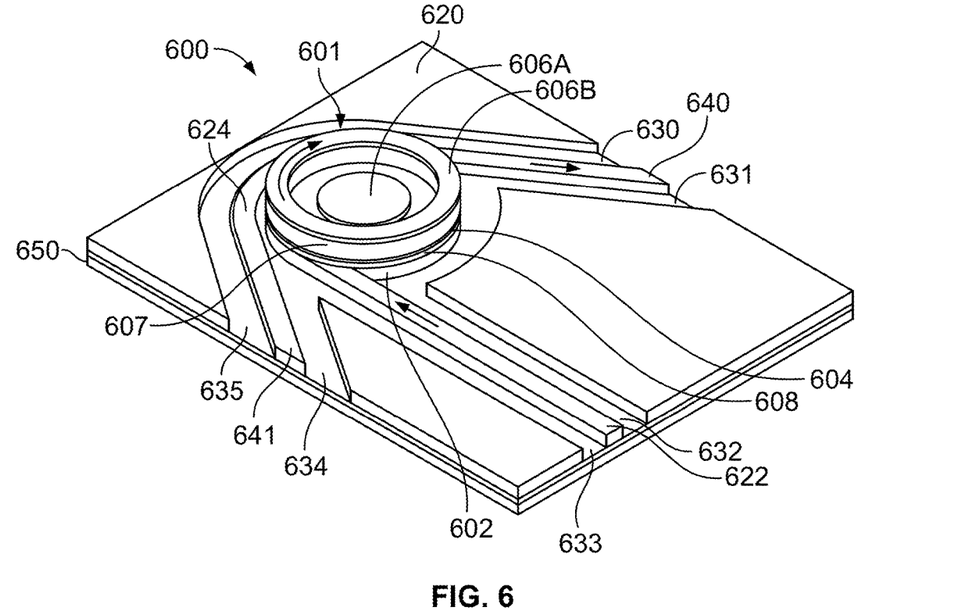
FIG. 6 shows a whistle-geometry ring laser heterogeneously integrated on a SOI platform for an embodiment of the present invention.

In one preferred embodiment, as shown in FIG. 6, a semiconductor light-emitting device 600 is provided that includes a hybrid III-V/silicon microring laser 601 (slave laser) that is an electrically pumped III-V microring laser heterogeneously integrated on top of a silicon microring or microdisk cavity 602 of the same or slightly different size and shape. The microring 601 may have circular, elliptical, oval, racetrack, or similar shape. For the embodiment shown in FIG. 6, a whistle-geometry ring laser may be integrated heterogeneously on a SOI platform 650. The device has an active region 604, a p-type cladding 607, which may be a top cladding, an n-type cladding 608, which may be a bottom cladding. In other embodiments, p-type cladding 607 may be a bottom cladding, and the opposingly located n-type cladding 608 may be a top cladding. Electrical contacts 606A and 606B, which may be metal, are also provided.

The SOI substrate 620 may have one or more Si waveguides formed therein. In a preferred embodiment, passive rib, ridge, or buried silicon waveguides 622 and 624 may be provided, which are in communication with Si microring 602 located directly under the III-V ring. Areas 630-635 may be provided to assist in confining light in the waveguides. The areas 630-635 may be located adjacent to the waveguides and have a lower index of refraction than the waveguides. The areas may be in the form of channels. The channels may be open (filled with air) or filled with a dielectric material, such as $SiO_2$.

In use, the hybrid III-V/silicon microring laser 601 is strongly injection-locked by an external laser light (master laser) supplied through a passive rib, ridge, or buried silicon waveguide 622. The output of directly modulated hybrid microring laser 601 is collected by an adjacent laterally-coupled rib, ridge, or buried silicon waveguide 624 for further processing in the silicon photonics integrated circuit or for transmission of the optical signal off the chip. In the latter case, the opposite arms 640 and 641 of the outcoupling waveguide 624 are terminated at the chip/air interface at or near the Brewster angle to minimize any back reflections towards microring or microdisk silicon cavity 602. The hybrid microring laser, injecting waveguide, and directional waveguide output coupler may be integrated on the same SOI substrate 650. The arrows in FIG. 6 indicate the direction of propagation of light in the injecting waveguide 622, the ring laser 601, and the output waveguide 640. Other embodiments, not shown in FIG. 6, can include transition tapers between the silicon input and output waveguides and the III-V ring resonator, with or without the silicon ring resonator underneath the III-V ring. The bottom n-side electrode can be placed outside the ring, similar to the design shown in FIG. 5. The input and/or output silicon waveguides can be coupled to optical fibers for data transmission between the chip and the external environment. In cryogenic applications, this enables data transmission into a cryogenic chamber and out of the chamber.

Figure 7:
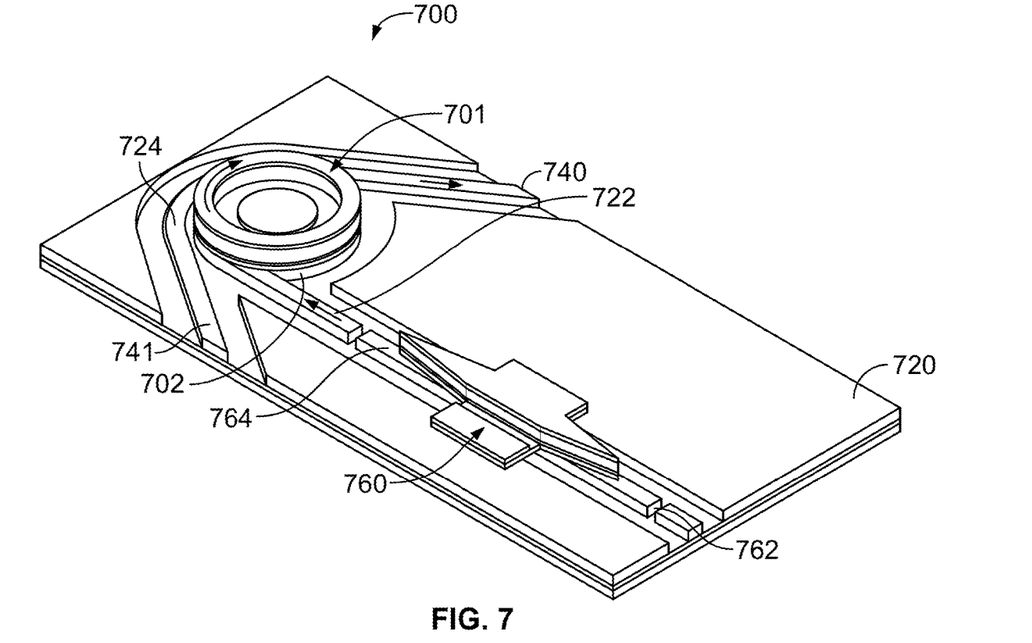
FIG. 7 shows a DBR master laser and a whistle-geometry slave ring laser heterogeneously integrated on a SOI platform for an embodiment of the present invention.

In another embodiment illustrated in FIG. 7, a semiconductor light-emitting device 700 is provided that includes the electrically pumped hybrid III-V/silicon microring laser of FIG. 6 strongly injection-locked by a hybrid III-V/silicon master DBR laser 760 that may be heterogeneously integrated on the same SOI substrate 720, as shown in FIG. 7. This embodiment uses the reflectivity of a back DBR mirror 762, which preferentially would be close to 100%, while the front DBR mirror 764 facing the slave laser 701 would preferentially have a lower reflectivity, so that most of the output of the master laser 760 would be guided towards the slave laser 701. The hybrid III-V/silicon microring laser 701 is strongly injection-locked by the output from the master laser 760 delivered through a passive rib, ridge, or buried silicon waveguide 722 to the microring or microdisk silicon cavity 702. The output of the directly modulated hybrid microring laser is collected by an adjacent laterally-coupled rib, ridge, or buried silicon waveguide 724 for further processing in the silicon photonics integrated circuit or for transmission of the optical signal off the chip. In the latter case, the opposite arms 740 and 741 of the outcoupling waveguide 724 are terminated at the chip/air interface at or near the Brewster angle to minimize any back reflections towards microring or microdisk silicon cavity 702. The arrows in FIG. 7 indicate the direction of propagation of light in the injecting waveguide 722, the ring laser 701, and the output waveguide 740. The output silicon waveguide 724 can be coupled to an optical fiber for data transmission outside the chip. In cryogenic applications, this enables data transmission out of the cryogenic chamber. In the embodiments shown in FIG. 6 and FIG. 7, the optical mode intensity is primarily confined in silicon waveguides and in the hybrid III-V/silicon laser cavities.

Figure 8A:
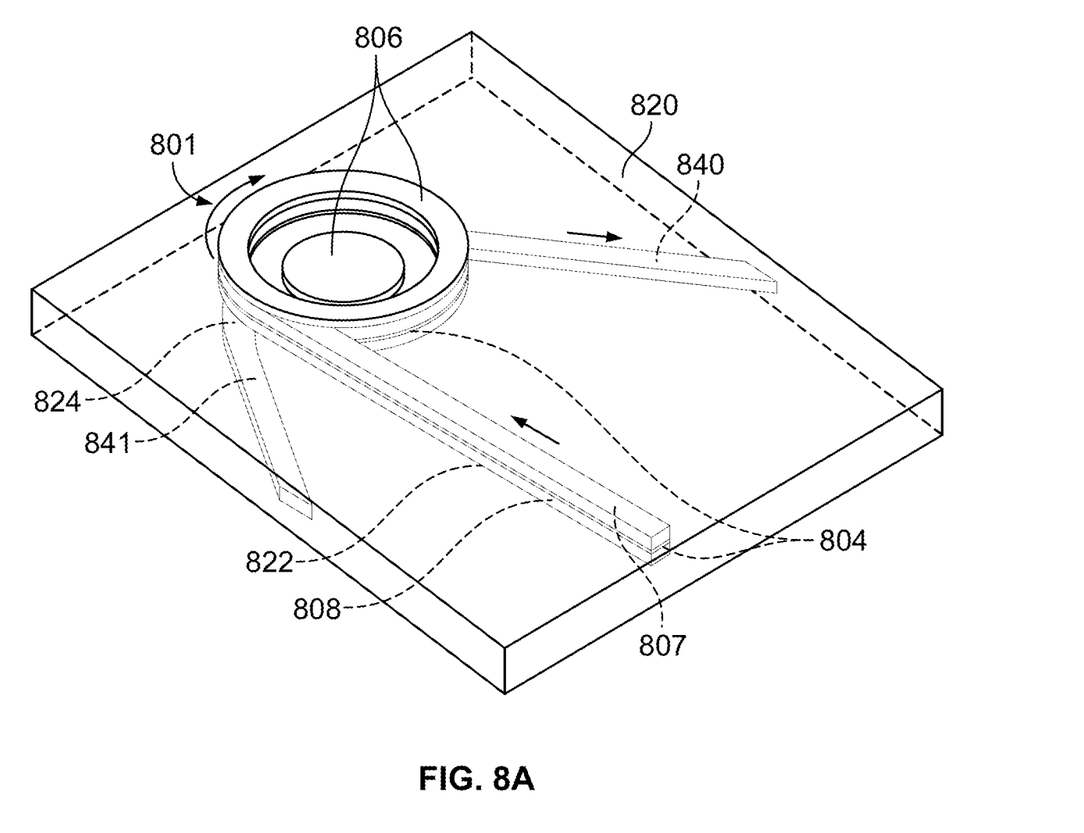
FIG. 8A is a perspective view of a III-V WRL laser and a III-V injecting waveguide heterogeneously integrated on a SOI platform with an outcoupling Si waveguide for an embodiment of the present invention.
Figure 8B:
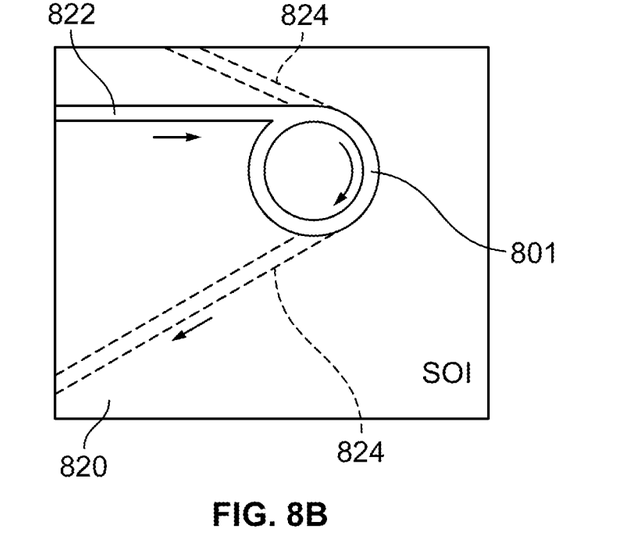
FIG. 8B is a top view of a III-V WRL laser and a III-V injecting waveguide heterogeneously integrated on a SOI platform with an outcoupling Si waveguide for an embodiment of the present invention.

In yet another embodiment, the compact III-V-based microring laser and a passive III-V-based injecting waveguide for external laser light injection may be integrated on the SOI platform in such a way that the injected light and microring laser intensities are primarily confined in the III-V active/optical waveguide layer of the III-V-based microring laser/injecting waveguide. For this embodiment, as shown in FIG. 8A and FIG. 8B, a III-V WRL laser 801 and injecting waveguide 822 may be heterogeneously integrated on a SOI platform 820 with a Si outcoupling waveguide 824 built on the SiO$_2$ substrate. Laser 801 and injecting waveguide 822 may also include multiple-quantum-well region 804, p- and n-type claddings 807 and 808, respectively. Laser 801 also includes metal contacts 806.

As further shown, the output of the directly modulated microring laser 801 is evanescently vertically coupled to ridge, rib, or buried Si waveguide 824 positioned underneath III-V microring laser 801 for further processing in the silicon photonics integrated circuit or for transmission of the optical signal off the chip. In the latter case, the opposite arms 840 and 841 of the outcoupling waveguide 824 are terminated at the chip/air interface at or near the Brewster angle to minimize any back reflections towards the microring laser 801. The arrows in FIG. 8A and FIG. 8B indicate the direction of propagation of light in the injecting waveguide 822, the ring laser 801, and the output waveguide 824. The input III-V waveguide 822 and/or the output silicon waveguide 824 can be coupled to optical fibers for data transmission outside the chip. In cryogenic applications, this enables data transmission into a cryogenic chamber and out of the chamber. The output Si waveguide 824, as shown in FIG. 8B, is built on the SiO$_2$ substrate 820 beneath the III-V-based microring laser 801 and has the same radius of curvature for the portion that overlaps with the microring.

Figure 9A:
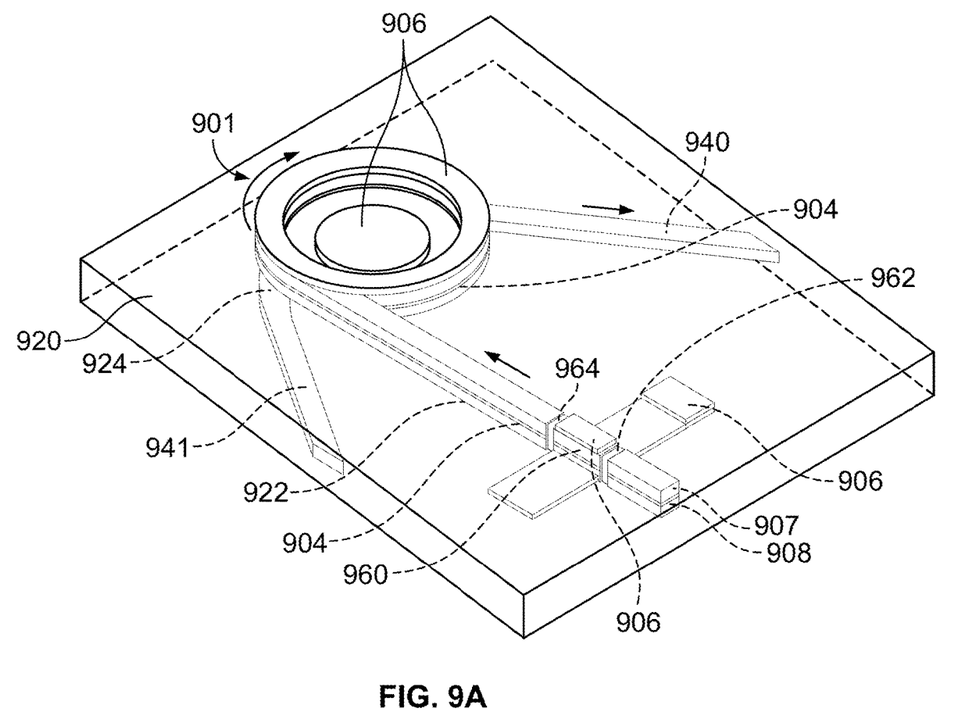
FIG. 9A is a perspective view of a III-V WRL laser, a III-V injecting waveguide, and a III-V DBR master laser heterogeneously integrated on a SOI platform with an outcoupling Si waveguide for an embodiment of the present invention.
Figure 9B:
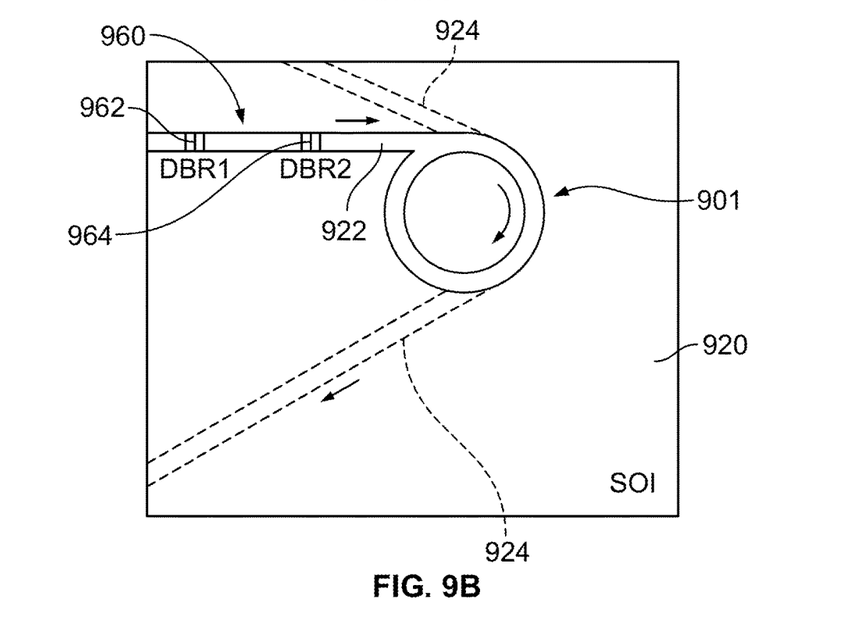
FIG. 9B is a top view of a III-V WRL laser, a III-V injecting waveguide, and a III-V DBR master laser heterogeneously integrated on a SOI platform with an outcoupling Si waveguide for an embodiment of the present invention.

In yet another embodiment, the electrically pumped hybrid III-V/silicon microring laser 901 is strongly injection-locked by a III-V master DBR laser 960 integrated on the same SOI substrate 920, as shown in FIG. 9A and FIG. 9B. In this embodiment, the mode intensity is also primarily confined in III-V waveguides and laser cavities. III-V WRL laser 901, III-V injecting waveguide 922, and III-V master DBR laser 960 are heterogeneously integrated on a SOI platform with an outcoupling Si waveguide 924 built on SiO$_2$ substrate. Also provided are multiple-quantum-well region 904, p- and n-type claddings 907 and 908, respectively. Metal contacts 906 for the WRL and the master DBR laser are also provided.

The reflectivity of back DBR mirror 962 would preferentially be close to 100%, while the front DBR mirror 964 facing slave laser 901 would preferentially have a lower reflectivity so that most of master laser 960 output would be guided towards slave laser 901.

As shown in FIG. 9B, the output of the directly modulated microring laser 901 is evanescently vertically coupled to a ridge, rib, or buried Si waveguide 924 positioned underneath the III-V microring laser 901 for further processing in the silicon photonics integrated circuit or for transmission of the optical signal off the chip. In the latter case, the opposite arms 940 and 941 of the outcoupling waveguide 924 are terminated at the chip/air interface at or near the Brewster angle to minimize any back reflections towards microring laser 901. The arrows in FIG. 9A and FIG. 9B indicate the direction of propagation of light in the injecting waveguide 922, the ring laser 901, and the output waveguide 924. The output silicon waveguide 924 can be coupled to an optical fiber for data transmission outside the chip. In cryogenic applications, this would enable data transmission out of a cryogenic chamber. The output Si waveguide 924 is built on the SiO$_2$ substrate beneath the III-V-based microring laser 901 and has the same radius of curvature for its part that overlaps with the microring.

The optoelectronic integrated circuits of FIGS. 6-9 and method embodiments can be extended to the corresponding monolithically integrated cascaded schemes, shown schematically in FIGS. 10-13, in which the output of one hybrid III-V/silicon microring laser is carried either by a passive rib, ridge, or buried silicon waveguide or by a passive III-V waveguide to another similar hybrid III-V/silicon microring laser. The hybrid III-V/silicon microring lasers shown in FIGS. 10-13 can be independently supplied with direct injection current and modulated at ultra-high speed through direct injection current modulation. Multiple stages of cascading can be implemented by taking this approach.

Figure 10:
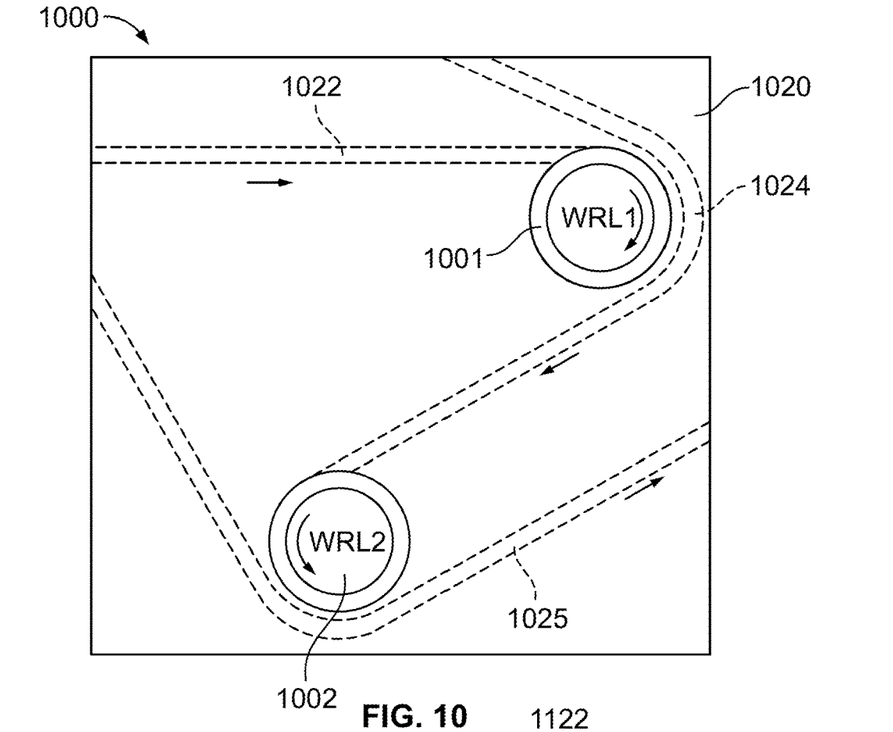
FIG. 10 is a top view of a cascaded III-V WRL laser system heterogeneously integrated on a SOI platform for an embodiment of the present invention.

In one embodiment, as shown in FIG. 10, a cascaded III-V WRL laser system 1000 is heterogeneously integrated on a SOI platform 1020. A plurality of III-V materials 1001 and 1002, which may be in the form of microrings, as described in FIG. 6, are provided. In use, the hybrid III-V/silicon microring laser 1001 is strongly injection-locked by an external laser light supplied through a passive rib, ridge, or buried silicon waveguide 1022. The output of directly modulated hybrid microring laser 1001 is collected by an adjacent laterally-coupled rib, ridge, or buried silicon waveguide 1024 and transmitted to strongly injection-locked III-V/silicon microring laser 1002. Additional silicon waveguides analogous to 1024 could be used if the cascade contains more microring lasers. The output of optically modulated hybrid III-V/silicon microring laser 1002 is collected by an adjacent laterally-coupled rib, ridge, or buried silicon waveguide 1025 for further processing in the silicon photonics integrated circuit, or to another strongly injection-locked III-V/silicon microring laser (not shown), or for transmission of the optical signal off the chip. The arrows in FIG. 10 indicate the direction of propagation of light in the injecting waveguide 1022, the ring lasers 1001 and 1002, the outcoupling/injecting waveguide 1024, and the output waveguide 1025. The input silicon waveguide 1022 and/or the output silicon waveguide 1025 can be coupled to optical fibers for data transmission between the chip and the external environment. In cryogenic applications, this enables data transmission into a cryogenic chamber and out of the chamber.

The embodiment shown in FIG. 10 may be constructed in accordance with other embodiments described above, such as that shown in FIG. 6.

Figure 11:
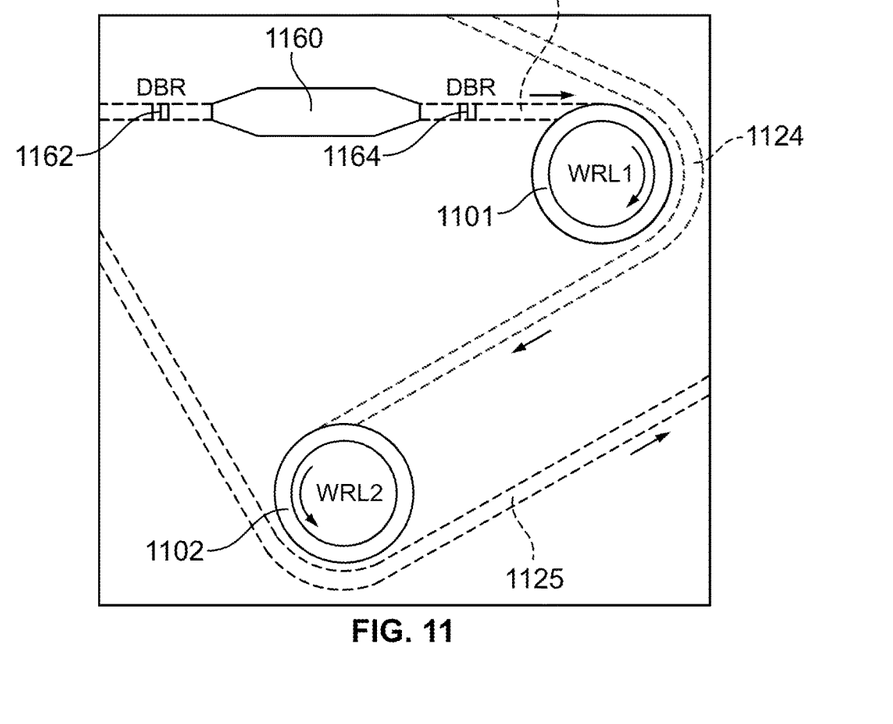
FIG. 11 is a top view of a cascaded III-V WRL laser system heterogeneously integrated on a SOI platform with a III-V master laser for an embodiment of the present invention.

FIG. 11 shows another embodiment of the present invention, which is a variation of the embodiment shown in FIG. 10. The embodiment further includes a hybrid III-V/silicon master DBR laser 1160. This embodiment uses the reflectivity of a back DBR mirror 1162, which preferentially would be close to 100%, while the front DBR mirror 1164 facing the slave laser 1101 would preferentially have a lower reflectivity so that most of the output of master laser 1160 would be guided towards slave laser 1101. The output of directly modulated hybrid III-V/silicon microring laser 1101 is collected by an adjacent laterally-coupled rib, ridge, or buried silicon waveguide 1124 and transmitted to strongly injection-locked III-V/silicon microring laser 1102. Additional silicon waveguides analogous to 1124 could be used if the cascade contains more microring lasers. The output of optically modulated hybrid III-V/silicon microring laser 1102 is collected by an adjacent laterally-coupled rib, ridge, or buried silicon waveguide 1125 for further processing in the silicon photonics integrated circuit, or to another strongly injection-locked III-V/silicon microring laser (not shown), or for transmission of the optical signal off the chip. The arrows in FIG. 11 indicate the direction of propagation of light in the injecting waveguide 1122, the ring lasers 1101 and 1102, the outcoupling/injecting waveguide 1124, and the output waveguide 1125. The output silicon waveguide 1125 can be coupled to an optical fiber for data transmission outside the chip. In cryogenic applications, this would enable data transmission out of a cryogenic chamber. The embodiment shown in FIG. 11 may be constructed in accordance with other embodiments described above, such as that shown in FIG. 7.

Figure 12:
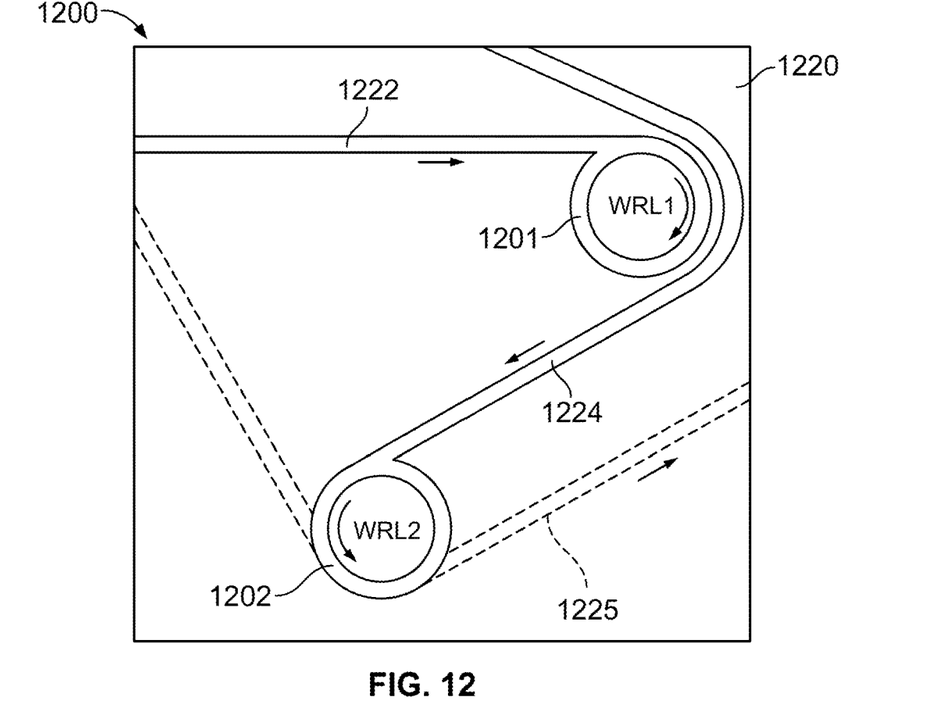
FIG. 12 is a top view of another embodiment of a cascaded III-V WRL laser system heterogeneously integrated on a SOI platform for an embodiment of the present invention.

FIG. 12 shows another embodiment of the present invention, which is a variation of the embodiment shown in FIG. 10. For this embodiment, a cascaded III-V WRL laser system 1200 is heterogeneously integrated on SOI platform 1220. Waveguides 1222 and 1224 and microrings 1201 and 1202 may be made of a III-V material. Outcoupling is performed by a silicon ridge, rib, or buried outcoupling waveguide 1225 built on $SiO_2$ substrate. Additional III-V waveguides analogous to 1224 could be used if the cascade contains more microring lasers. As further shown, the output of the optically modulated hybrid III-V/silicon microring laser 1202 is evanescently vertically coupled to the Si waveguide 1225 positioned underneath the microring laser 1202 for further processing in the silicon photonics integrated circuit or for transmission of the optical signal off the chip. The arrows in FIG. 12 indicate the direction of propagation of light in the injecting waveguide 1222, the ring lasers 1201 and 1202, the outcoupling/injecting waveguide 1224, and the output waveguide 1225. The input III-V waveguide 1222 and/or the output silicon waveguide 1225 can be coupled to optical fibers for data transmission between the chip and the external environment. In cryogenic applications, this enables data transmission into a cryogenic chamber and out of the chamber. The embodiment shown in FIG. 12 may be constructed in accordance with the embodiments described above, such as that described in FIG. 8A and FIG. 8B.

Figure 13:
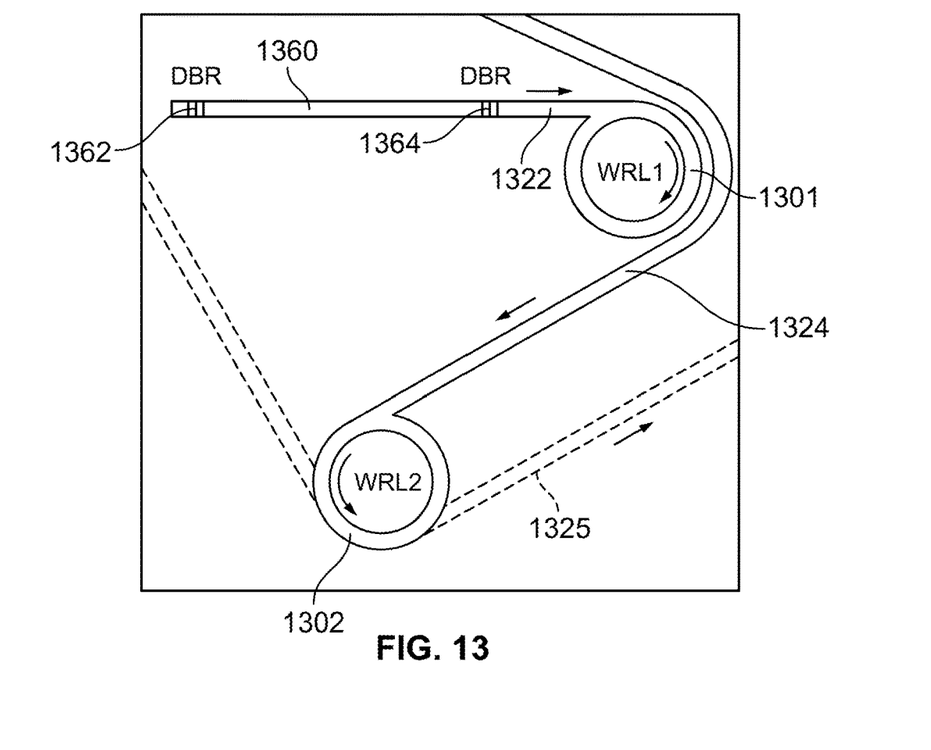
FIG. 13 is a top view of another embodiment of a cascaded III-V WRL laser system heterogeneously integrated on an SOI platform with a III-V master laser for an embodiment of the present invention.

FIG. 13 shows another embodiment of the present invention, which is a variation of the embodiment shown in FIG. 12. This embodiment further includes a III-V master DBR laser 1360, and uses the reflectivity of a back DBR mirror 1362, which preferentially would be close to 100%, while the front DBR mirror 1364 facing the slave laser 1301 would preferentially have a lower reflectivity so that most of the output of the master laser 1360 would be guided towards the slave laser 1301. Additional III-V waveguides analogous to 1324 could be used if the cascade contains more microring lasers. The output of the optically modulated hybrid III-V/silicon microring laser 1302 is evanescently vertically coupled to a ridge, rib, or buried Si waveguide 1325 positioned underneath the microring laser 1302 for further processing in the silicon photonics integrated circuit or for transmission of the optical signal off the chip. The arrows in FIG. 13 indicate the direction of propagation of light in the injecting waveguide 1322, the ring lasers 1301 and 1302, the outcoupling/injecting waveguide 1324, and the output waveguide 1325. The output silicon waveguide 1325 can be coupled to an optical fiber for data transmission outside the chip. In cryogenic applications, this would enable data transmission out of a cryogenic chamber.

For all embodiments of the present invention, a low-power cryogenic optical data link is disclosed, based on strongly injection-locked high-speed hybrid III-V/silicon WRLs disclosed above driven by a superconducting digital logic signal. The WRL is injection-locked by a stable single-frequency master laser, as described above, that may be incorporated inside (monolithically and efficiently coupled with the injection-locked WRL, and optimized for low-temperature operation) or outside of the cryogenic environment. The master laser wavelength is chosen to select a mode at or near the gain peak wavelength of the WRL active region, when the latter is maintained at the internal laser temperature in a cryogenic ambient.

Figure 14:
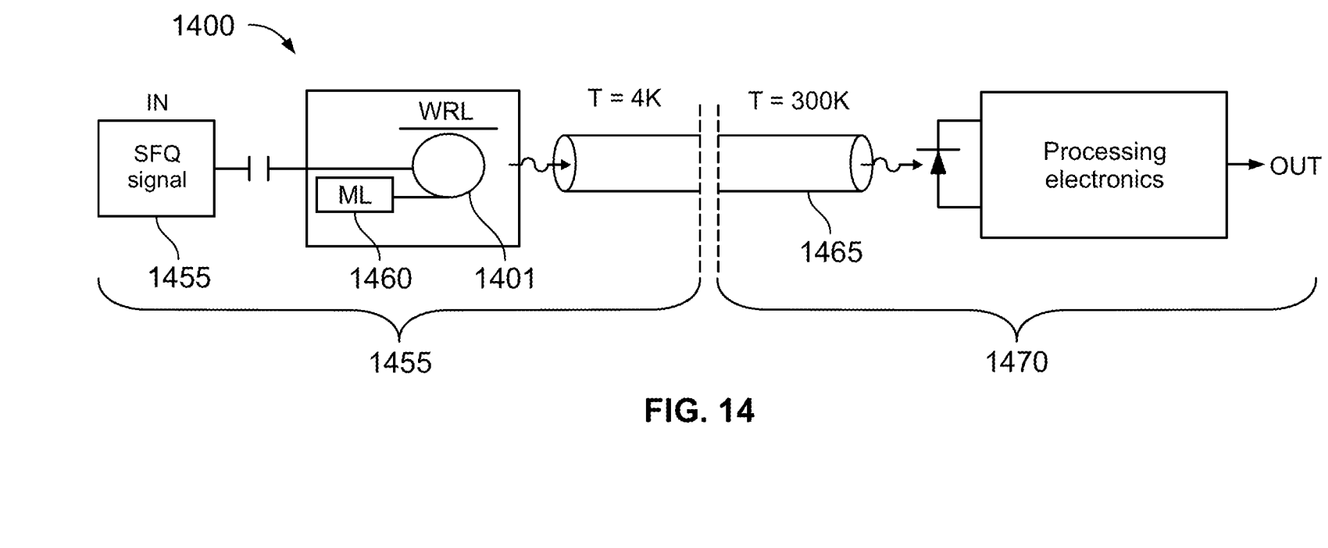
FIG. 14 shows a system for optical read-out of SFQ signals for an embodiment of the present invention.

FIG. 14 shows the overall optical link 1400. Applying the superconducting digital logic signal 1455 to microring laser 1401, incorporated inside the cryogenic environment 1455, is possible even at temperatures around 4 K. In that case, the hybrid III-V/silicon WRL 1401 strongly injection-locked by the master DBR laser 1460, as described above, is directly modulated by the superconducting digital logic signal 1455. In the case of cascaded WRLs, the superconducting digital logic signal is applied to either the first WRL or the master laser, and the modulated optical output of the second (or last, if more than two WRLs are used in the cascade) WRL is transferred to the room temperature environment 1470 via an optical fiber 1465.

In a preferred embodiment, the present invention provides devices and methods that may directly operate with signals that are already in digital format, as obtained by means of superconducting rapid single flux quantum (SFQ) digital circuit technology. Output from SFQ circuits to room temperature is challenging, since SFQ circuits produce signals of a few mV, whereas drivers for coaxial or optical inputs typically require volt-level signals. The embodiments of the present invention overcome this power differential by providing a low-power broadband (up to ~100 GHz) cryogenic optical data link for digital electric data egress from ~4 K to room temperature, based on strongly injection-locked semiconductor ring lasers driven by superconducting digital logic signals as described above. Signals already in digital format can be used directly, as the cryogenic computer system operates with digital data at ~4 K encoded using single flux quantum pulses in superconducting circuits. The modulated laser output is transmitted to the room temperature environment using optical fiber 1465.

Low operation voltage (typically 0.8 V for 1.55 μm InP-based semiconductor lasers), small injection current (of the order of few mA), and low impedance (resistance R~2 ω, comparable to that of the SFQ signal source) alleviate the problem of impedance matching and signal amplification required to boost superconductor signals to drive traditional optical modulator structures.

Fabrication of the III-V components pursuant to the invention can be conducted using conventional semiconductor laser production operations. A preferred method for growing the epitaxial semiconductor wafer for fabrication of the devices in the present invention is the metal-organic chemical vapor deposition (MOCVD). Other epitaxial growth techniques, including metal-organic vapor-phase epitaxy (MOVPE) and molecular beam epitaxy (MBE), as well as other semiconductor material systems and other epitaxial layer structures, are applicable to the present invention. After the growth of the epitaxial semiconductor wafer, its bonding to the SOI substrate, and removal of the III-V substrate, the portions of the wafer undergo further processing that results in the creation of the III-V ridge-waveguide structures forming all the functional sections of the device and lithographically aligned to the underlying SOI pattern. An exemplary process using electron beam lithography and liftoff is described in U.S. Pat. No. 8,009,712 incorporated herein by reference, although other fabrication processes, such as focused ion beam etching, can be employed.

Although certain embodiments of the invention have been described in detail herein, those skilled in the art will appreciate that modifications and changes can be made therein with the scope of the invention as set forth in the appended claims.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above-described embodiments, methods, and examples, but by all embodiments and methods within the scope and spirit of the disclosure.

What is claimed is:

1. A semiconductor light-emitting device comprising:
   a silicon-on-insulator (SOI) substrate;
   a silicon injecting waveguide formed in said substrate;
   a first passive silicon ring or disk formed in said substrate, said first passive silicon ring or disk directly connected to said silicon injecting waveguide in a whistle configuration;
   a first silicon outcoupling waveguide formed in said substrate, said first silicon outcoupling waveguide adjacent to said first passive silicon ring or disk and laterally evanescently coupled to said first passive silicon ring or disk;
   a first active ring or disk laser formed on top of said first passive silicon ring or disk, and vertically optically coupled to said first passive silicon ring or disk; and
   optical output of said first active ring or disk laser is coupled to said first passive silicon ring or disk and collected by said first silicon outcoupling waveguide.

2. The device of claim 1, wherein said first silicon outcoupling waveguide is directed at or near the Brewster angle with respect to the chip edge to reduce back reflections towards said first passive silicon ring or disk.

3. The device of claim 1, wherein said first silicon outcoupling waveguide further delivers the output from said first active ring or disk laser to a silicon photonic-electronic circuit integrated on said substrate.

4. The device of claim 1, wherein said first passive and active rings or disks are circular, elliptical, oval, or racetrack, and said first passive and active rings or disks are of the same size and shape or slightly different in their size and shape.

5. The device of claim 1, wherein said first active ring or disk laser is made of III-V materials, is electrically pumped, and is integrated on top of said first passive silicon ring or disk.

6. The device of claim 1, further including a second laser coupled to said silicon injecting waveguide, with said second laser acting as a single-frequency master laser, and said first active ring or disk laser acting as a slave laser.

7. The device of claim 6, wherein said master laser is a distributed-Bragg-reflector or distributed-feedback laser made of III-V materials and integrated on top of said silicon injecting waveguide.

8. The device of claim 6, wherein said first silicon outcoupling waveguide is directed at or near the Brewster angle with respect to the chip edge to reduce back reflections towards said first passive silicon ring or disk.

9. The device of claim 6, wherein said first silicon outcoupling waveguide further delivers the output from said first active ring or disk laser to a silicon photonic-electronic circuit integrated on said substrate.

10. The device of claim 6, wherein said first passive and active rings or disks are circular, elliptical, oval, or racetrack, and said first passive and active rings or disks are of the same size and shape or slightly different in their size and shape.

11. The device of claim 6, wherein said first active ring or disk laser is made of III-V materials, is electrically pumped, and is integrated on top of said first passive silicon ring or disk.

* * * * *